US008067313B2

(12) United States Patent
Nakamura

(10) Patent No.: US 8,067,313 B2
(45) Date of Patent: Nov. 29, 2011

(54) SEMICONDUCTOR DEVICE, METHOD OF MANUFACTURING THE SAME, AND ELECTRONIC APPARATUS

(75) Inventor: Akihiro Nakamura, Kumamoto (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 12/657,799

(22) Filed: Jan. 28, 2010

(65) Prior Publication Data

US 2010/0193914 A1 Aug. 5, 2010

(30) Foreign Application Priority Data

Feb. 4, 2009 (JP) .............................. P2009-023221

(51) Int. Cl.
H01L 21/302 (2006.01)
H01L 21/461 (2006.01)
H01L 23/48 (2006.01)
H01L 23/52 (2006.01)
H01L 23/40 (2006.01)

(52) U.S. Cl. .......................... 438/714; 257/774; 257/773

(58) Field of Classification Search .................. 438/714, 438/709.71; 257/773, 618, 774, E21.499, 257/E21.054, E21.597
See application file for complete search history.

(56) References Cited

U.S. PATENT DOCUMENTS

| 5,470,763 | A | 11/1995 | Hamada |
| 6,515,303 | B2 * | 2/2003 | Ring ............................... 257/77 |
| 7,786,592 | B2 * | 8/2010 | Trezza ........................... 257/777 |
| 7,834,461 | B2 * | 11/2010 | Asai et al. ...................... 257/774 |
| 2002/0055265 | A1 * | 5/2002 | Ring .............................. 438/714 |
| 2002/0066960 | A1 * | 6/2002 | Ring .............................. 257/774 |
| 2003/0129771 | A1 * | 7/2003 | Summerfelt et al. ............. 438/3 |
| 2004/0188707 | A1 * | 9/2004 | Kurokawa et al. ............. 257/192 |
| 2007/0002039 | A1 | 1/2007 | Pendleton et al. |
| 2007/0139416 | A1 | 6/2007 | Azuma |
| 2009/0104738 | A1 * | 4/2009 | Ring et al. ...................... 438/172 |
| 2009/0184423 | A1 * | 7/2009 | Erturk et al. .................... 257/751 |
| 2010/0193914 | A1 * | 8/2010 | Nakamura ...................... 257/618 |
| 2010/0264548 | A1 * | 10/2010 | Sanders et al. ................. 257/774 |
| 2010/0295100 | A1 * | 11/2010 | Huang et al. ................... 257/256 |
| 2010/0307582 | A1 * | 12/2010 | Arai ............................... 136/256 |

FOREIGN PATENT DOCUMENTS

| JP | 07-094746 A | 4/1995 |
| JP | 2003250141 A | 9/2003 |
| JP | 2003333570 A | 11/2003 |
| JP | 2006060532 A | 3/2006 |
| JP | 2006312088 A | 11/2006 |
| JP | 2007-102503 A | 4/2007 |
| JP | 2008-108769 A | 5/2008 |

(Continued)

OTHER PUBLICATIONS

European Search Report EP 10151856, dated Jul. 2, 2010. Office Action from Japanese Application No. 2009-024302, dated Jan. 25, 2011.

*Primary Examiner* — Walter L Lindsay, Jr.
(74) *Attorney, Agent, or Firm* — Lerner, David, Littenberg, Krumholz & Mentlik, LLP

(57) ABSTRACT

Disclosed is a method of manufacturing a semiconductor device including forming a transistor on a first surface of a device substrate, forming a hole in a second surface opposite to the first surface of the device substrate, and supplying hydrogen to a gate insulating film of the transistor from the second surface of the device substrate through the hole.

8 Claims, 10 Drawing Sheets

FOREIGN PATENT DOCUMENTS

| | | |
|---|---|---|
| JP | 2008211796 A | 9/2008 |
| WO | 9510915 A1 | 4/1995 |
| WO | 0010075 A1 | 2/2000 |
| WO | 0178050 A2 | 10/2001 |
| WO | 02071334 A2 | 9/2002 |
| WO | 20040032516 A2 | 4/2004 |

\* cited by examiner

SEMICONDUCTOR DEVICE, METHOD OF MANUFACTURING THE SAME, AND ELECTRONIC APPARATUS

CROSS-REFERENCE TO RELATED APPLICATION

The present application claims priority from Japanese Patent Application No. JP 2009-023221 filed in the Japanese Patent Office on Feb. 4, 2009, the entire content of which is incorporated herein by reference.

BACKGROUND OF THE INVENTION

1. Field of the Invention

The present invention relates to a semiconductor device including a transistor, a method of manufacturing a semiconductor device, and an electronic apparatus.

2. Description of the Related Art

As a form of a semiconductor device, a solid-state image sensor is known. Examples of a typical solid-state image sensor include a CCD image sensor and a CMOS image sensor. The solid-state image sensor of this type has a noise characteristic as a pixel characteristic. Noises of a solid-state image sensor are roughly classified into a random noise and a fixed pattern noise. Further, examples of a typical random noise include a dark current shot noise, an FD (floating diffusion) reset noise, an FD amplifier noise, and a light shot noise.

Further, causes of the noise arise from the following items (1) to (4):

(1) a deep level of a forbidden band of silicon,
(2) a thermal noise in a case where a capacitance C is charged,
(3) a level of a gate insulating film of a transistor of an amplifier that forms an FD amplifier, and
(4) a property of a photon inherent in light.

Out of those items, in a recent solid-state image sensor, a noise due to the above item (1) has become negligibly small. Further, a noise due to the above item (2) can be suppressed in a circuit. Therefore, the noise of the solid-state image sensor is caused dominantly due to the above item (3). In a case where an amount of light is large as an image-taking condition, a noise due to the above item (4) may be more marked than the noise due to the item (3).

Against such a technical background, there has been proposed a technique that reduces an interface state of a gate insulating film of a transistor formed on a device substrate of a semiconductor device by supplying hydrogen. In addition, there has been proposed a method of reducing an interface state of a gate insulating film by supplying hydrogen in order to recover Swing or Vth (threshold voltage) of a transistor in a semiconductor device having a TFT structure in which a polysilicon thin film is used or in a semiconductor device that uses an SOI substrate. For example, Japanese Patent Application Laid-open No. HEI7-94746 (hereinafter, referred to as Patent Document 1) discloses a technique that supplies hydrogen to a gate insulating film under a gate electrode by setting an oxide film formed on the gate electrode to be thin enough to allow hydrogen to diffuse therein. It should be noted that the TFT is an abbreviated name of a "thin film transistor", and the SOI is an abbreviated name of a "silicon on insulator".

In the technique disclosed in Patent Document 1 mentioned above, in the case where hydrogen is supplied to the gate insulating film of the transistor, various films (such as an interlayer insulating film, a barrier metal film of a wiring layer, and a diffusion prevention layer of a copper wiring) formed on an upper layer of the transistor exist as films that hinder the supply of hydrogen. Therefore, there is a problem in that hydrogen is difficult to be efficiently supplied to the gate insulating film.

In view of this, Japanese Patent Application Laid-open No. 2008-108769 (hereinafter, referred to as Patent Document 2) discloses a technique of grinding or polishing a back surface of a semiconductor substrate, on a front surface of which a transistor is formed, to thin the semiconductor substrate, and thereafter supplying hydrogen to a gate insulating film of a transistor from the back surface of the semiconductor substrate.

SUMMARY OF THE INVENTION

However, in the technique disclosed in Patent Document 2, if the semiconductor substrate is thinned in order to efficiently supply hydrogen to the gate insulating film from the back surface of the semiconductor substrate, rigidity of the substrate itself is decreased. As a result, it becomes difficult to handle the semiconductor substrate in subsequent processes. Further, if the semiconductor substrate is ground or polished to a smaller extent in order to secure the rigidity thereof, it becomes difficult to efficiently supply hydrogen to the gate insulating film.

In view of the above-mentioned circumstances, it is desirable to provide a technique that can secure the rigidity of a device substrate and efficiently supply hydrogen to a gate insulating film at the same time.

According to an embodiment of the present invention, there is provided a method of manufacturing a semiconductor device including forming a transistor on a first surface of a device substrate, forming a hole in a second surface opposite to the first surface of the device substrate, and supplying hydrogen to a gate insulating film of the transistor from the second surface of the device substrate through the hole.

In the method of manufacturing a semiconductor device according to the embodiment of the present invention, after the transistor is formed on the first surface of the device substrate, the hole is formed in the second surface of the device substrate, and then hydrogen is supplied, with the result that hydrogen more easily reaches the gate insulating film of the transistor as compared to a case where the hole is not formed.

According to another embodiment of the present invention, there is provided a semiconductor device including: a device substrate having a first surface and a second surface opposite to the first surface, and a transistor formed on the first surface of the device substrate. The device substrate has a hole in the second surface.

In the semiconductor device according to the embodiment of the present invention, in the structure of the device substrate, the hole is formed in the second surface opposite to the first surface on which the transistor is formed. With this structure, in a case where the semiconductor device is manufactured, hydrogen is supplied from the second surface of the device substrate through the hole. As a result, hydrogen more easily reaches the gate insulating film of the transistor as compared to the case where the hole is not formed.

According to the embodiment of the present invention, it is possible to supply hydrogen to the gate insulating film more efficiently by forming holes in the second surface of the device substrate in a case of supplying hydrogen from the second surface of the device substrate to the gate insulating film of the transistor that is a target of the hydrogen supplying operation. Further, a thick portion in the surface of the device substrate where the holes are not formed contributes to maintenance of the rigidity of the semiconductor substrate. As a result, it becomes possible to secure the rigidity of the device substrate and efficiently supply hydrogen to the gate insulating film at the same time.

These and other objects, features and advantages of the present invention will become more apparent in light of the following detailed description of best mode embodiments thereof, as illustrated in the accompanying drawings.

DESCRIPTION OF PREFERRED
EMBODIMENTS

Hereinafter, embodiments of the present invention will be described with reference to the drawings. It should be noted that a technical scope of the present invention is not limited to the following embodiments, and the present invention may include various modifications and alterations insofar as they are within the scope in which a specific effect can be obtained from the constituents of the present invention or combinations thereof.

Figure 1:
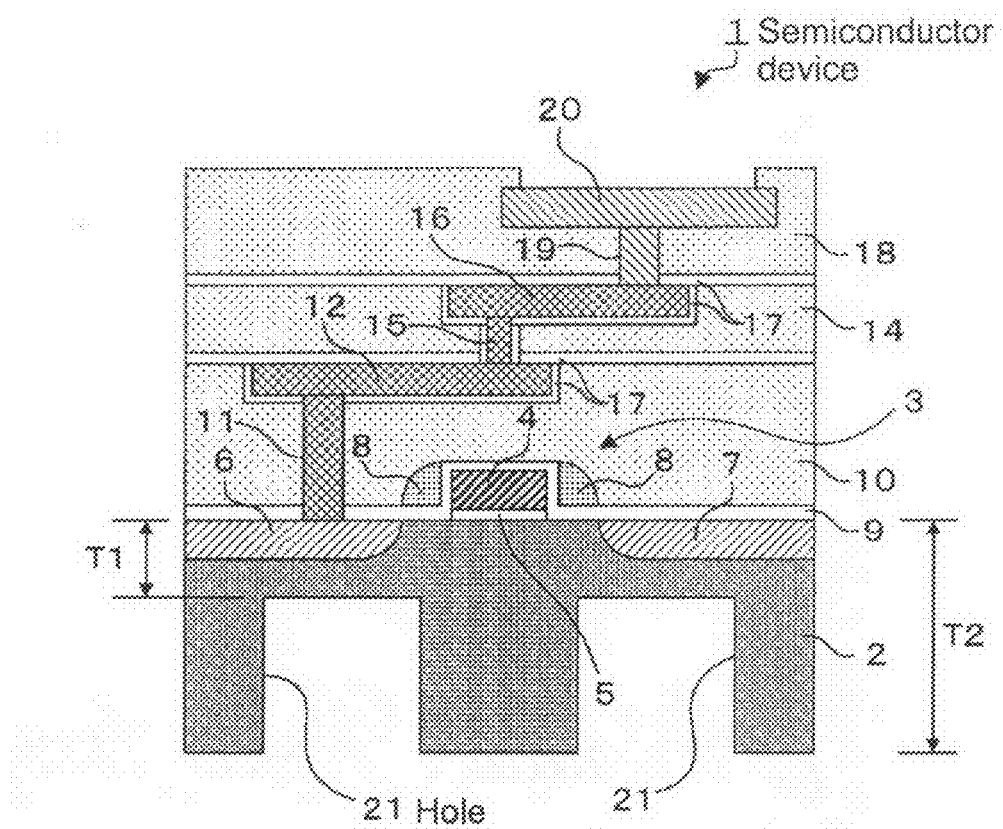
FIG. 1 is a cross-sectional view showing a structure of a semiconductor device according to a first embodiment of the present invention.

The embodiments of the present invention will be described in an order of the following items.
1. First embodiment
2. Second embodiment
3. Third embodiment
4. Fourth embodiment
5. Application example 1. First Embodiment Structure of Semiconductor Device FIG. 1 is a cross-sectional view showing a structure of a semiconductor device according to a first embodiment of the present invention. A semiconductor device 1 shown in FIG. 1 includes a semiconductor substrate 2 as a device substrate. The semiconductor substrate 2 is formed of a silicon substrate that is a P-type semiconductor substrate. On a first surface (upper surface) of the semiconductor substrate 2, a transistor is formed. The transistor 3 is constituted of a gate electrode 4, a gate insulating film 5, a source region 6, and a drain region 7. The gate electrode 4 is formed on the gate insulating film 5. The gate electrode 4 is made of polysilicon, for example. The gate insulating film 5 is intervened between the gate electrode 4 and the semiconductor substrate 2. The gate insulating film 5 is made of a silicon oxide film, for example. On both side surfaces of the gate electrode 4, sidewalls 8 are formed. The source and drain regions 6 and 7 are each formed of an N-type impurity region. The source and drain regions 6 and 7 are formed in the semiconductor substrate 2 in a self-alignment manner by performing an iontophoresis (ion implantation) of impurities with the sidewalls 8 being used as a mask.

On the first surface of the semiconductor substrate 2, an insulating film 9 is formed to entirely cover the gate electrode 4 and the source and drain regions 6 and 7. The insulating film 9 is formed of laminated films of a silicon oxide film and a silicon nitride film that are laminated in the stated order. In addition, on the first surface of the semiconductor substrate 2, a first interlayer insulating film 10 is formed to cover the transistor 3. In the first interlayer insulating film 10, a contact portion 11 and a first wiring layer 12 that are conducted to the transistor 3 are formed. On the first interlayer insulating film 10, a second interlayer insulating film 14 is formed. In the second interlayer insulating film 14, a contact portion 15 and a second wiring layer 16 that are conducted to the first wiring layer 12 are formed. The first wiring layer 12 and the second wiring layer 16 are formed with an embedded structure by a damascene process using copper as a wiring material. Further, on a surface of each of the first interlayer insulating film 10 and the second interlayer insulating film 14 and in a wiring groove portion thereof, a diffusion prevention film 17 for preventing copper from diffusing is formed. The diffusion prevention film 17 is formed of a silicon nitride film, for example.

Further, on the second interlayer insulating film 14, a passivation film 18 is formed. The passivation film 18 is formed of laminated films of a silicon oxide film and a silicon nitride film that are laminated in the stated order, for example. In the passivation film 18, a contact portion 19 and an electrode pad portion 20 that are conducted to the second wiring layer 16 are formed. The electrode pad portion 20 is formed of an aluminum pad, for example. A surface of the electrode pad portion 20 is exposed to outside from an opening portion formed in the passivation film 18.

On the other hand, a second surface (lower surface) of the semiconductor substrate 2 has a plurality of holes 21. The first surface and the second surface of the semiconductor substrate 2 correspond to the double faces thereof. In general, the first surface on which the transistor 3 and the wiring layers (12 and 16) conducted thereto are formed is referred to as the "front surface" of the semiconductor substrate 2. The second surface that is opposite to the first surface is referred to as the "back surface" of the semiconductor substrate 2. In the second surface of the semiconductor substrate 2, The plurality of holes 21 are formed in positions at equal distances from the gate insulating film 5 of the transistor 3. The holes 21 are formed so that the semiconductor substrate 2 is partly dug from the second surface in a depth direction (substrate thickness direction). Therefore, in the substrate surface of the semiconductor substrate 2, a thickness T1 of part where the holes are formed is smaller (thinner) than a thickness T2 of part where the holes are not formed. In this case, a difference (T2−T1) of the thicknesses corresponds to a depth of each of the holes 21. It is desirable to set the thickness T1 to 100 μm or less, more desirably, 10 μm or less (in both cases, a minimum value is larger than 0) with the depth of each of the holes 21 being set as a parameter. This reason will be described later.

(Method of Manufacturing Semiconductor Device)

Figure 2:
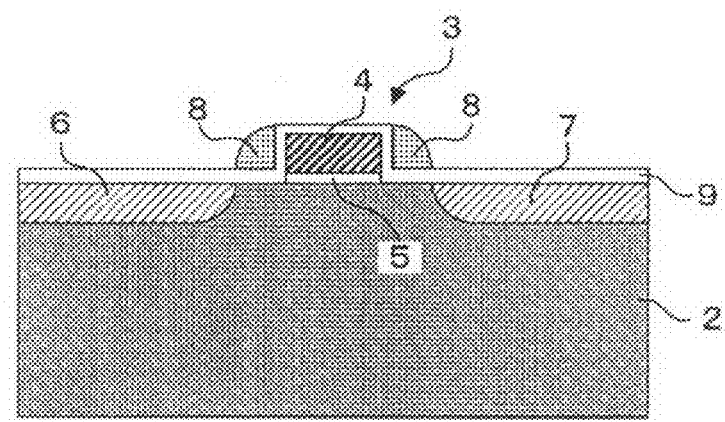
FIG. 2 is a diagram (part 1) for explaining a method of manufacturing a semiconductor device according to the first embodiment of the present invention.

First, a semiconductor substrate 2 in a wafer state is prepared, and the transistor 3 is formed on the first surface of the semiconductor substrate 2 as shown in FIG. 2. The process of forming the transistor 3 includes a process of forming the gate insulating film 5, a process of forming the gate electrode 4, a process of forming the insulating film 9, a process of forming the sidewalls 8, and a process of forming the source and drain regions 6 and 7.

Figure 3:
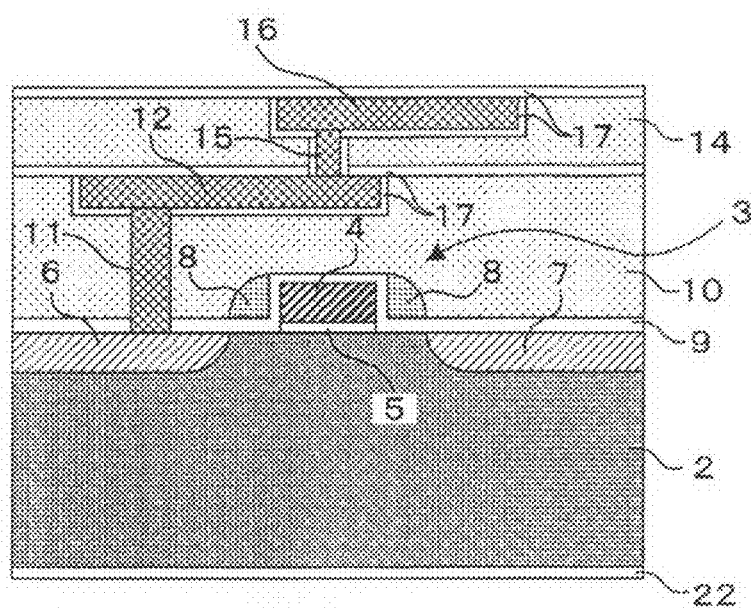
FIG. 3 is a diagram (part 2) for explaining the method of manufacturing a semiconductor device according to the first embodiment of the present invention.

Next, as shown in FIG. 3, by using a well-known wiring process, the first interlayer insulating film 10, the contact portion 11, the first wiring layer 12, the second interlayer insulating film 14, the contact portion 15, the second wiring layer 16, and the diffusion prevention film 17 are formed on the first surface side of the semiconductor substrate 2. At the same time when the diffusion prevention film 17 is formed, a film 22 made of the same material as that of the diffusion prevention film 17 is formed on the second surface of the semiconductor substrate 2.

Figure 4:
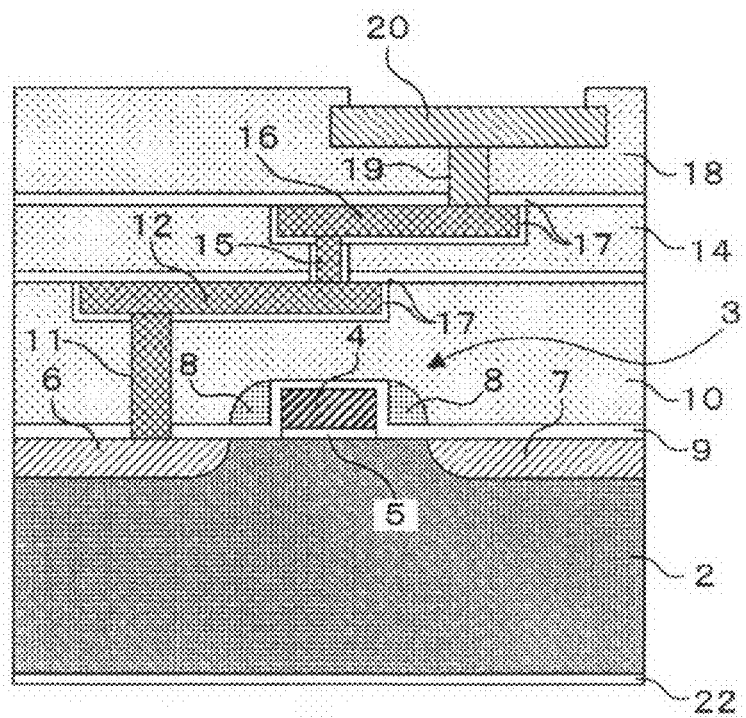
FIG. 4 is a diagram (part 3) for explaining the method of manufacturing a semiconductor device according to the first embodiment of the present invention.

Next, as shown in FIG. 4, on the second interlayer insulating film 14 on the first surface side of the semiconductor substrate 2, the passivation film 18, the contact portion 19, and the electrode pad portion 20 are formed. The surface of the electrode pad portion 20 is exposed to outside by forming the opening portion in the passivation film 18.

Figure 5:
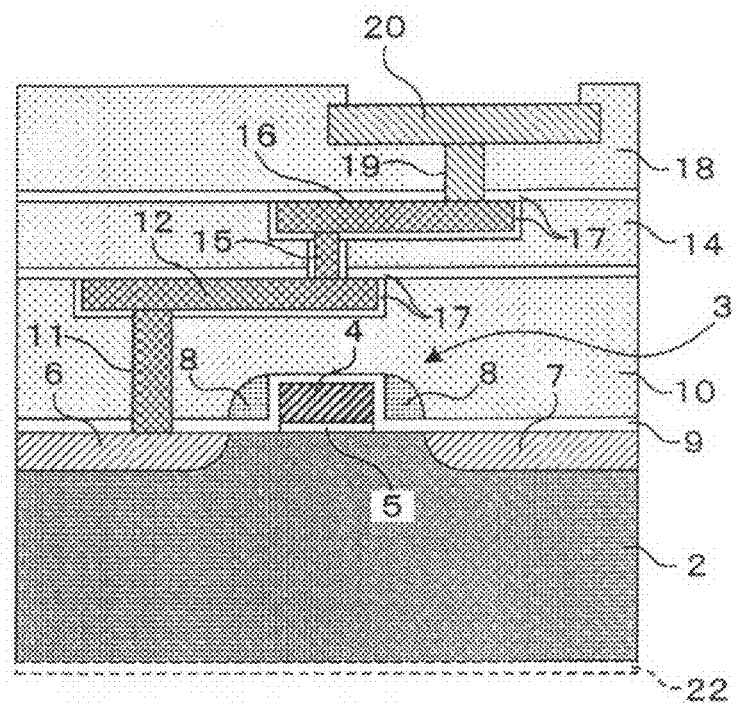
FIG. 5 is a diagram (part 4) for explaining the method of manufacturing a semiconductor device according to the first embodiment of the present invention.

Next, as shown in FIG. 5, the film 22 that covers the second surface of the semiconductor substrate 2 is removed by an etching or polishing. With the removal process, the second surface of the semiconductor substrate 2 is exposed to outside. At this time, the etching or polishing of the second surface of the semiconductor substrate 2 may not only remove the film 22 but also thin the semiconductor substrate 2. When the semiconductor substrate 2 is thinned in this stage, it is possible to reduce a time period used for a subsequent process of forming the holes 21. Here, to "thin" means reducing of the entire thickness of the semiconductor substrate 2.

Figure 6:
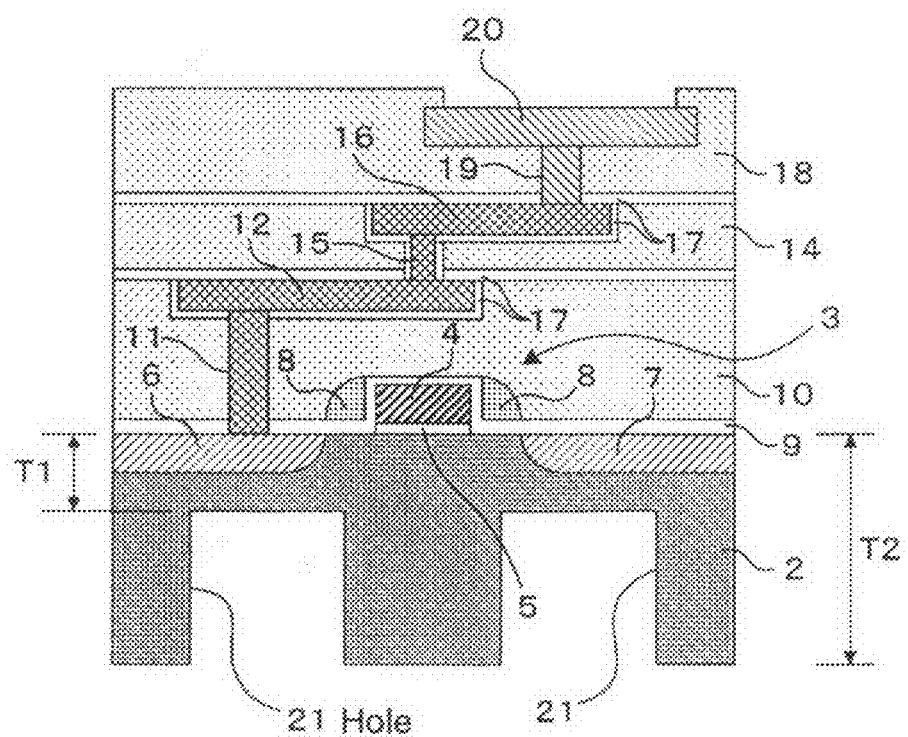
FIG. 6 is a diagram (part 5) for explaining the method of manufacturing a semiconductor device according to the first embodiment of the present invention.

Next, as shown in FIG. 6, in the second surface of the semiconductor substrate 2, the plurality of holes 21 are formed by a predetermined depth. It is desirable to form the holes 21 in positions at equal distances from the gate insulating film 5 of the transistor 3. As a method of forming the holes 21, the etching method may be used, for example. Desirably, the holes 21 are formed by an anisotropic etching in which plasma is used, which can uniform diameters of the holes in the depth direction.

Figure 7:
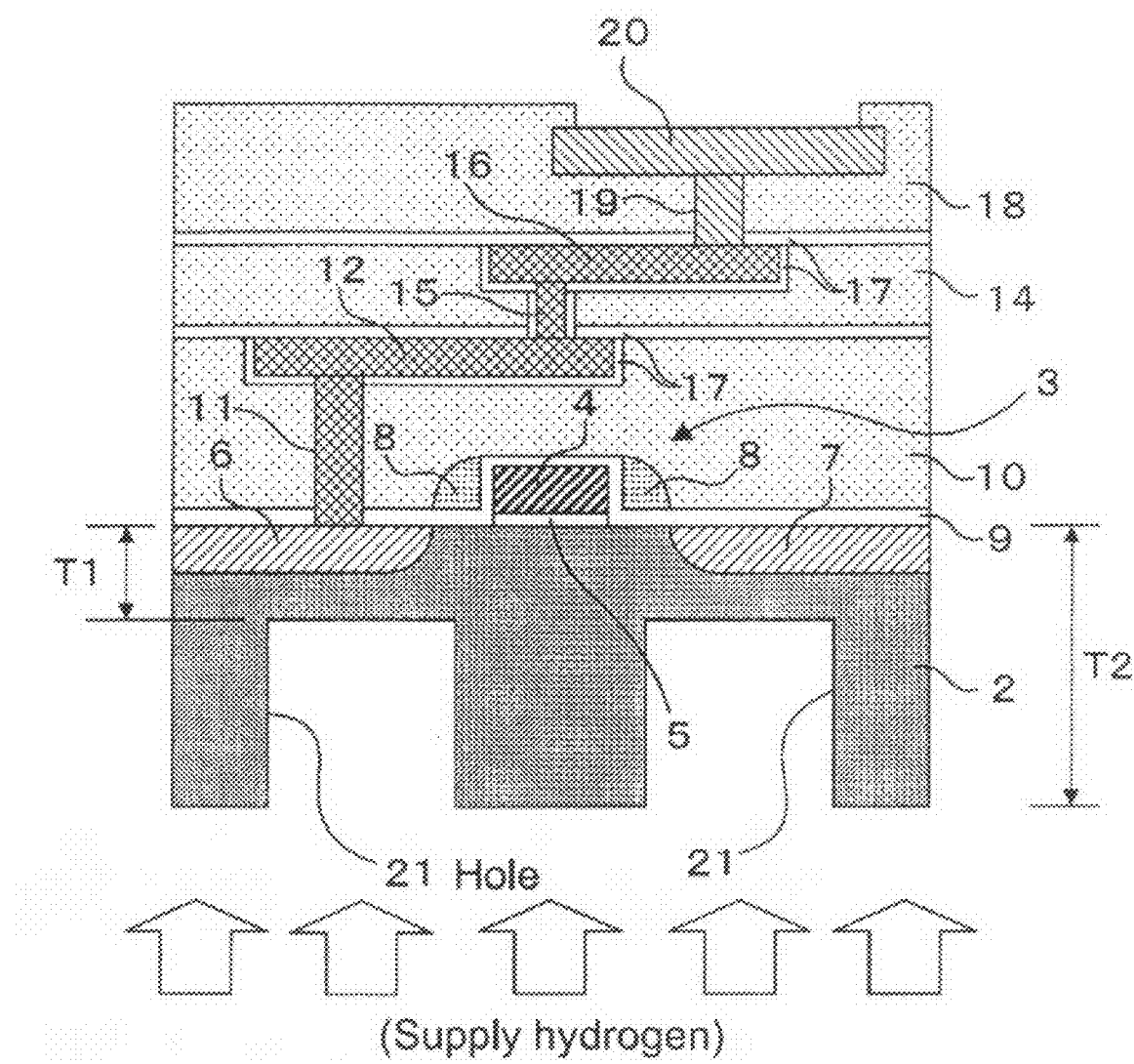
FIG. 7 is a diagram (part 6) for explaining the method of manufacturing a semiconductor device according to the first embodiment of the present invention.

Next, as shown in FIG. 7, hydrogen is supplied to the gate insulating film 5 of the transistor 3 from the second surface of the semiconductor substrate 2 through the holes 21 previously formed. The supplying operation of hydrogen may be performed by a hydrogen sintering process, a hydrogen annealing process (annealing process with a gas containing hydrogen), or a hydrogen plasma process (plasma process with a gas containing hydrogen). In addition to those processes, the supplying operation of hydrogen may be performed by a hydrogen ion implantation process and an annealing process. In this case, hydrogen ions are implanted to the second surface of the semiconductor substrate 2, and then the annealing process is performed on the semiconductor substrate 2.

In the hydrogen supplying operation as described above, because the second surface of the semiconductor substrate 2 has the plurality of holes 21 in the previous holing process, the thickness T1 of the part where the holes 21 are formed is smaller than the thickness T2 of the part where the holes 21 are not formed. Therefore, hydrogen more easily reaches the gate insulating film 5 of the transistor 3 as compared to a case where the holes 21 are not formed in the second surface of the semiconductor substrate 2. In addition, in the semiconductor substrate 2, the thickness T2 of the part where the holes 21 are not formed is larger than the thickness T1 of the part where the holes 21 are formed. Therefore, the rigidity of the semiconductor substrate 2 is maintained thanks to the thickness of the part where the holes 21 are not formed. Thus, in the case where hydrogen is supplied from the second surface of the semiconductor substrate 2, by previously forming the plurality of holes 21 in the second surface of the semiconductor substrate 2, hydrogen can be efficiently supplied to the gate insulating film 5 of the transistor 3 without unnecessarily decreasing the rigidity of the semiconductor substrate 2.

Figure 8:
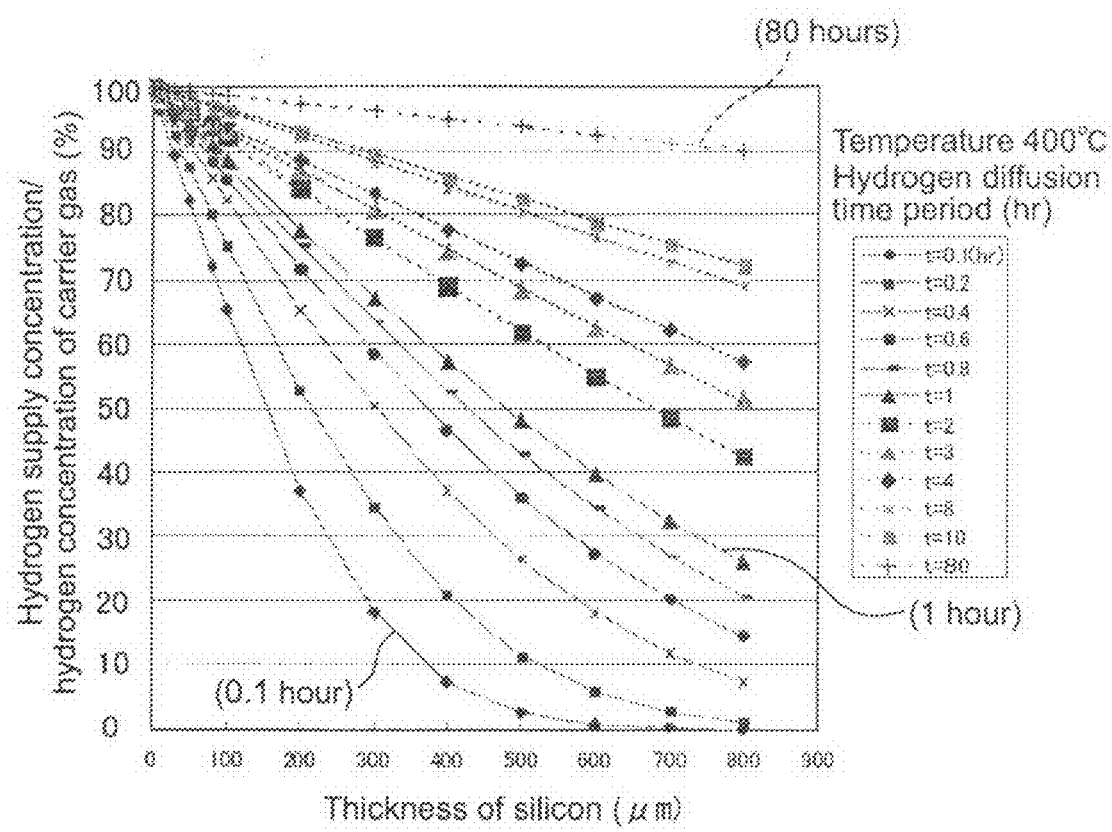
FIG. 8 is a diagram showing a result of a simulation of a hydrogen concentration with respect to a depth direction (thickness direction) of a silicon substrate in a case where hydrogen is supplied from a second surface (back surface) of the silicon substrate to diffuse hydrogen in the silicon substrate.

Here, FIG. 8 is a diagram showing a graph of a result of a simulation of a hydrogen concentration with respect to the depth direction (thickness direction) of the silicon substrate in a case where hydrogen is diffused in the silicon by supplying hydrogen from the second surface (back surface) of the silicon substrate. It should be noted that FIG. 8 shows the graph of the result of the simulation in which a hydrogen diffusion time period is variously set. In the graph, as a vertical axis, set is a hydrogen supply concentration obtained by normalization with a hydrogen concentration of a carrier gas being set as a reference concentration. As a horizontal axis, the thickness of the silicon is set. As can be seen from FIG. 8, in a case where the hydrogen supplying operation is performed by the hydrogen sintering process under a general condition of 400° C. for 1 hour, hydrogen corresponding to only a little less than 30% of the hydrogen concentration of the carrier gas can be supplied from the back surface, with the silicon substrate (wafer) having a general thickness of about 800 μm. Further, in order to supply hydrogen corresponding to 90% or more of the hydrogen concentration of the carrier gas from the back surface of the silicon substrate for the same process time period or for a time period close thereto, it is necessary to set the thickness of the substrate to 100 μm or less. In other words, by setting the thickness of the semiconductor substrate to 100 μm or less, hydrogen corresponding to 90% or more of the hydrogen concentration of the carrier gas can be supplied from the back surface of the silicon substrate.

Based on the simulation result, in this embodiment of the present invention, the thickness T1 of the part where the holes 21 are formed is set to 100 μm or less so that hydrogen corresponding to 90% or more of the hydrogen concentration of the carrier gas is supplied to the gate insulating film 5 from the second surface (back surface) of the semiconductor substrate 2. In addition, the thinner the silicon substrate, the larger the hydrogen concentration of part that is a target of the hydrogen supplying operation. Accordingly, it is desirable to set the thickness T1 of the part where the holes 21 are formed to 10 μm or less. In contrast, the thickness T2 of the part where the holes 21 are not formed contributes to maintenance of the rigidity of the semiconductor substrate 2 because of its thick portion. Accordingly, the thickness (typical thickness of about 800 μm) of the semiconductor substrate 2 before the transistor 3 is formed may be maintained as it is. In addition, in the case where the semiconductor substrate 2 is thinned before the hydrogen supplying process is performed as described above, it is desirable to set the thickness T2 of the part where the holes 21 are not formed to a range in which the rigidity necessary for handling the semiconductor substrate 2 can be maintained.

Further, after hydrogen is supplied from the back surface of the semiconductor substrate 2, it is desirable to perform a heat treatment under a condition of 450° C. or less in subsequent processes (including a manufacturing process of the semiconductor device 1 and a setting process thereafter). By defining the upper-limit temperature in the heat treatment after the hydrogen supplying process, it is possible to effectively suppress hydrogen supplied to the gate insulating film 5 of the transistor 3 from being eliminated due to the heat treatment. Thus, deterioration of the characteristics of the transistor 3 due to the elimination of hydrogen can be avoided.

Figure 9:
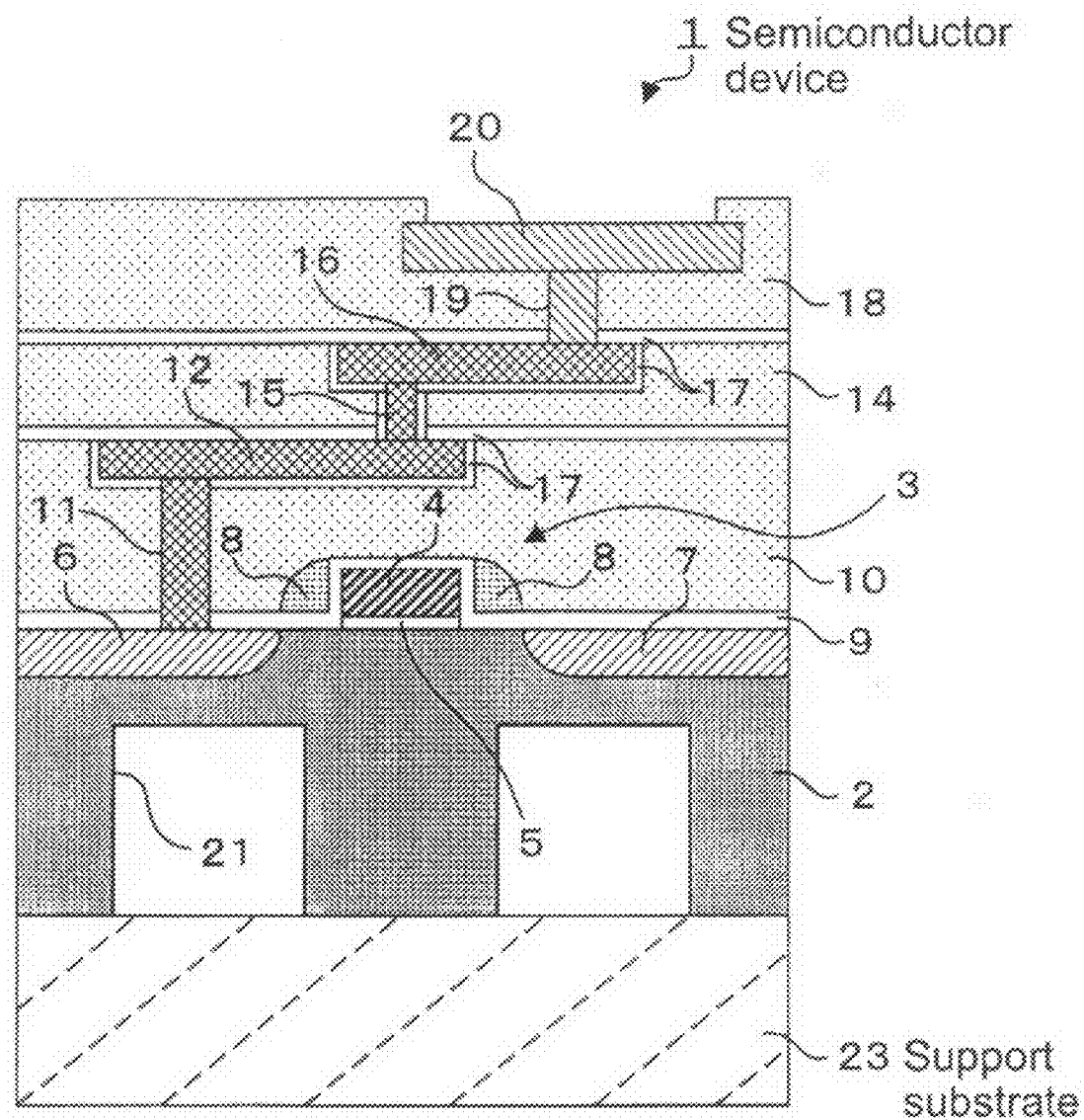
FIG. 9 is a cross-sectional view showing an example of a device structure to which a support substrate is provided.
Figure 14:
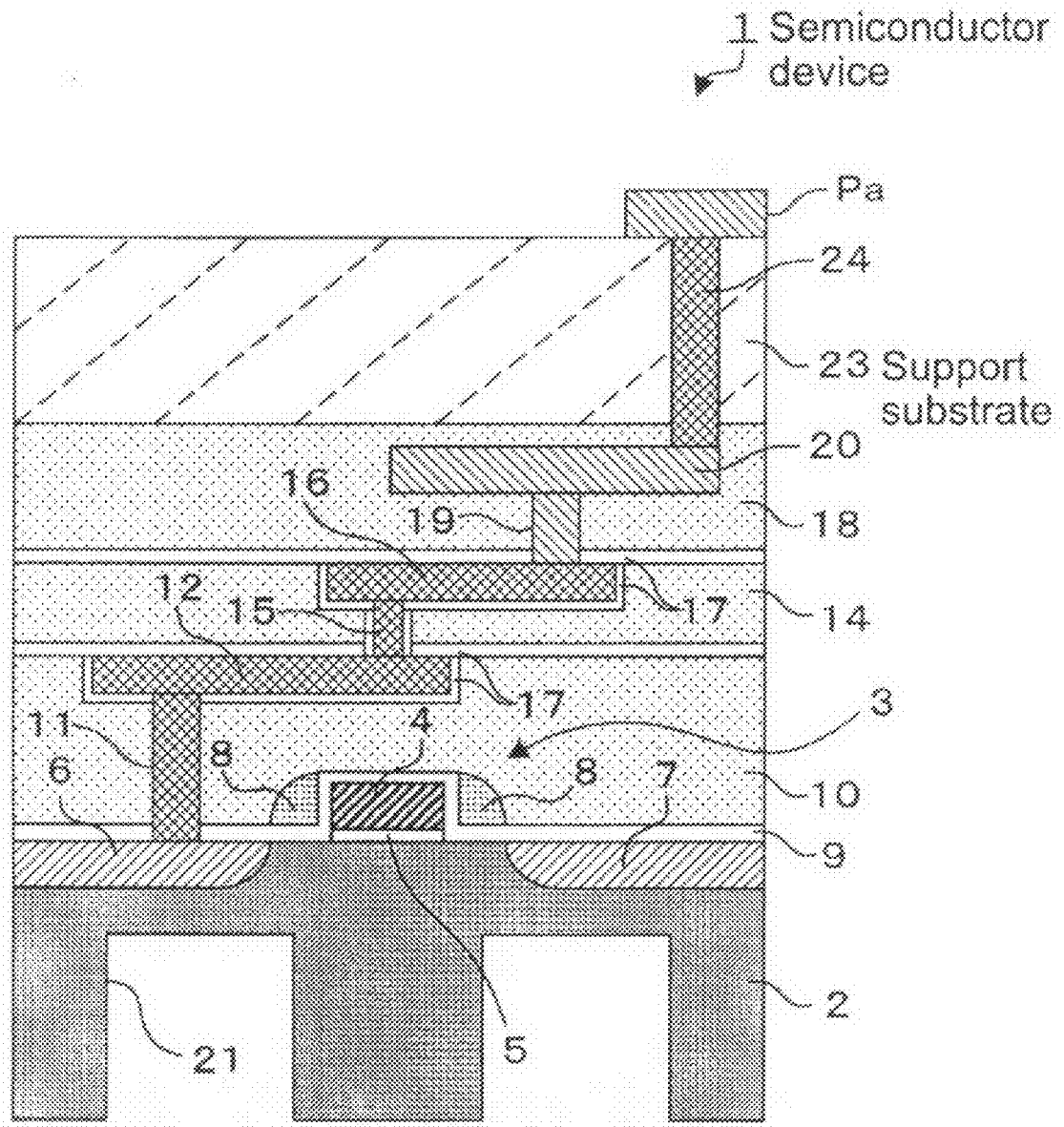
FIG. 14 is a cross-sectional view showing a structure of a semiconductor device of a modified example of the present invention.

Further, in the process after hydrogen is supplied, a support substrate 23 may be bonded to the second surface of the semiconductor substrate 2 as shown in FIG. 9. Alternatively, as shown in FIG. 14, the support substrate 23 may be bonded to the first surface of the semiconductor substrate 2. In this case, a via hole 24 may be formed so as to penetrate the support substrate 23, and a pad electrode Pa may be formed on an end portion of the via hole 24. Further, although not shown, the pad electrode may be formed on the second surface of the semiconductor substrate 2 through the insulating film, and the pad electrode may be electrically connected to the transistor 3 through the via hole finally. The bonding of the substrates may be performed by using an intermolecular force or by using a bonding adhesive or the like. It is desirable to use, as the support substrate 23, a substrate having a plate shape and having the same outline and size as the semiconductor substrate 2 in the wafer state. In addition, as the support substrate 23, a silicon substrate made of the same substrate material as the semiconductor substrate 2 may be used, or another substrate such as a glass substrate and a sapphire substrate may be used. With the structure in which the support substrate 23 is bonded to the semiconductor substrate 2, the strength of the entire substrate can be enhanced. As a result, deformation (e.g., warpage) of the semiconductor substrate 2 can be prevented.

2. Second Embodiment

Figure 10:
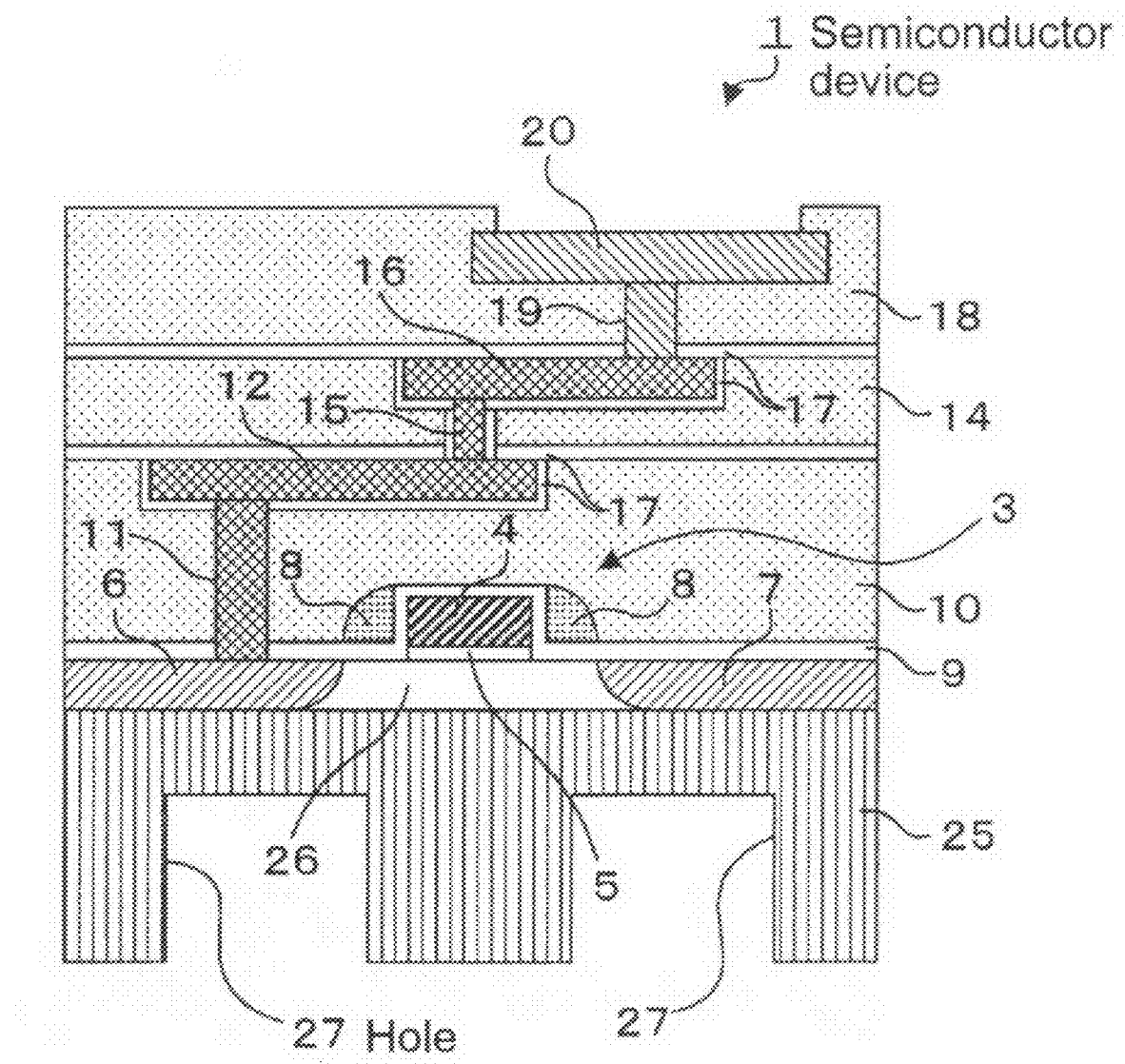
FIG. 10 is a cross-sectional view showing a structure of a semiconductor device according to a second embodiment of the present invention.

FIG. 10 is a cross-sectional view showing a structure of a semiconductor device according to a second embodiment of the present invention. The semiconductor device 1 shown in FIG. 10 includes a glass substrate 25 as a device substrate. On a first surface (upper surface) of the glass substrate 25, a polysilicon thin film 26 is formed. On the polysilicon thin film 26, the source region 6 and the drain region 7 of the transistor 3 are formed. In a second surface (lower surface) of the glass substrate 25, a plurality of holes 27 are formed under the same condition as in the case of the semiconductor substrate 2 described above. The plurality of holes 27 are formed for the same purpose as the holes 21. The other structure, basic manufacturing processes (manufacturing method), and operations and effects are the same as in the first embodiment, and therefore their descriptions will be omitted. It should be noted that the glass substrate is used as the device substrate in this case, but a sapphire substrate may instead be used as the device substrate. In addition, regardless of whether the glass substrate or the sapphire substrate is used as the device substrate, a diffusion coefficient of hydrogen with respect to the substrate material is almost the same order as in the case of using the silicon substrate. Thus, the thicknesses in the case where the holes are formed in the second surface of the device substrate may be set in the same condition as the first embodiment.

3. Third Embodiment

Figure 11:
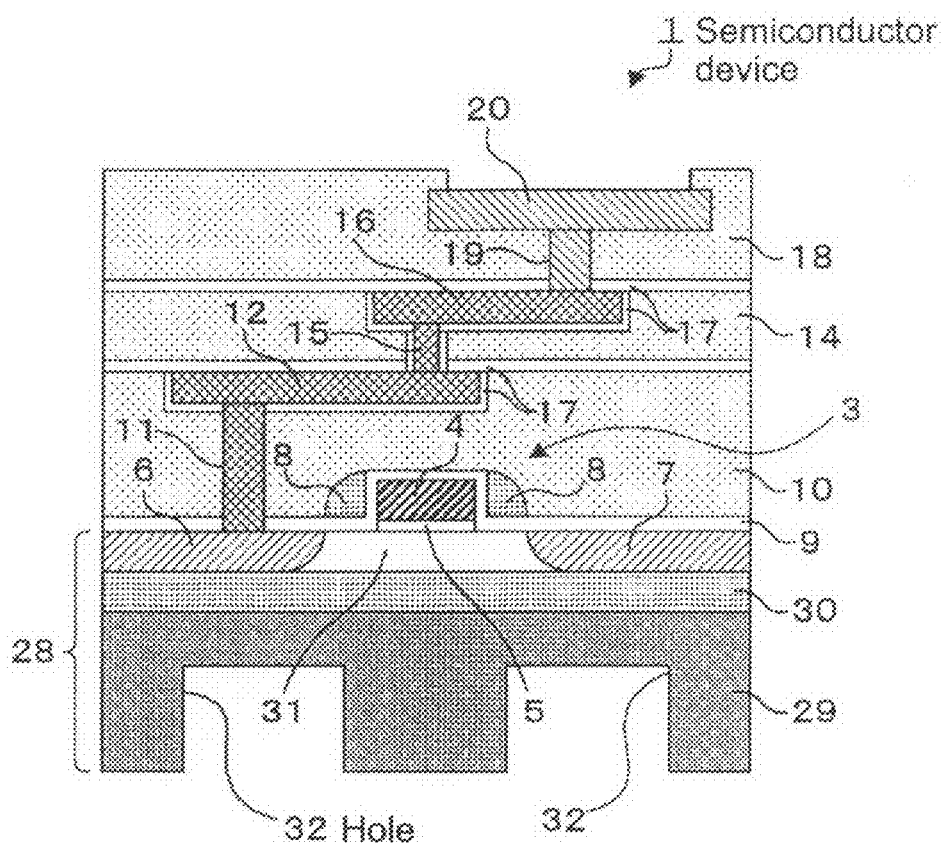
FIG. 11 is a cross-sectional view showing a structure of a semiconductor device according to a third embodiment of the present invention.

FIG. 11 is a cross-sectional view showing a structure of a semiconductor device according to a third embodiment of the present invention. The semiconductor device 1 shown in FIG. 11 includes an SOI substrate 28 as a device substrate. The SOI substrate 28 is constituted of a silicon substrate 29 as a base, a BOX oxide film 30, and a crystalline silicon thin film 31. The BOX oxide film 30 is formed of a silicon oxide film. The BOX oxide film 30 and the crystalline silicon thin film 31 are formed on a surface (upper surface) of the silicon substrate 29 in a laminated manner in the stated order. Of those, in the crystalline silicon thin film 31, the source and drain regions 6 and 7 of the transistor 3 are formed. Further, on the other surface (lower surface) of the silicon substrate 29 corresponding to the second surface of the SOI substrate 28, a plurality of holes 32 are formed under the same condition as in the case of the semiconductor substrate 2 described above. The plurality of holes 32 are formed for the same purpose as the holes 21. The holes 32 are formed so as not to reach the BOX oxide film 30, but may be formed to reach the BOX oxide film 30. The other structure, basic manufacturing processes (manufacturing method), and operations and effects are the same as in the first embodiment, and therefore their descriptions will be omitted. It should be noted that even when the SOI substrate is used as the device substrate, a diffusion coefficient of hydrogen with respect to the silicon or the silicon oxide is almost the same order. Thus, the thicknesses in the case where the holes are formed in the second surface of the device substrate may be set in the same condition as the first embodiment.

4. Fourth Embodiment

Figure 12:
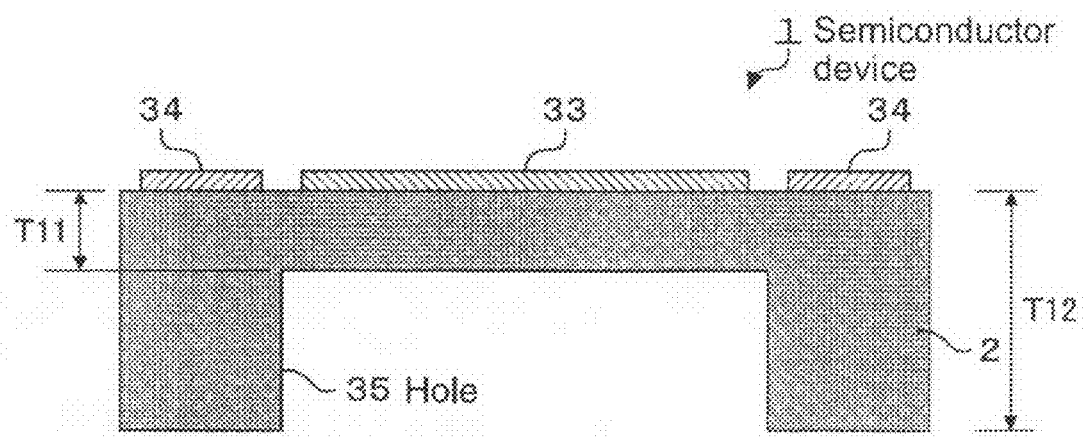
FIG. 12 is a cross-sectional view showing a structure of a semiconductor device according to a fourth embodiment of the present invention.

FIG. 12 is a cross-sectional view showing a structure of a semiconductor device according to a fourth embodiment of the present invention. Here, as a specific example of the semiconductor device, a solid-state image sensor such as a CCD image sensor and a CMOS image sensor is considered. As a device substrate of the semiconductor device 1 formed of the solid-state image sensor, the semiconductor substrate 2 formed of the silicon substrate is used, for example. On the first surface (upper surface) of the semiconductor substrate 2, a pixel array portion 33 and peripheral circuit portions 34 are provided. The pixel array portion 33 is formed into a quadrangle (rectangle in many cases) in a planar view, and the peripheral circuit portions 34 are formed on an outer area of the pixel array portion 33. Although not shown, in the pixel array portion 33, a photoelectric converter such as a photodiode, a transistor for reading a signal charge generated by photoelectric conversion in the photoelectric converter, and the like are formed. Although not shown, in each of the peripheral circuit portions 34, a drive circuit for driving a pixel, an electrode pad, and the like are formed.

On the second surface (lower surface) of the semiconductor substrate 2, a hole 35 is formed. The hole 35 is formed into a quadrangle shape in a planar view on a backside of the surface on which the pixel array portion 33 is formed. The hole 35 has the size equal to or larger than the pixel array portion 33. In the semiconductor substrate 2, in an inner side area relative to the area where the peripheral circuits 34 are formed, the hole 35 is formed. Therefore, a thickness T11 of the part where the pixel array portion 33 is formed (i.e., where the hole 35 is formed) of the semiconductor substrate 2 is smaller than a thickness T12 of a part where the peripheral circuit portions 34 are formed (i.e., where the hole 35 is not formed).

For manufacturing the semiconductor device 1 described above, the pixel array portion 33 including the transistor is formed on the first surface of the semiconductor substrate 2, then, the hole 35 is formed on the second surface of the semiconductor substrate 2, and thereafter hydrogen is supplied to the gate insulating film of the transistor through the hole 35 from the second surface of the semiconductor substrate 2. As a result, with respect to all the transistors formed in the pixel array portion 33, hydrogen can be supplied through the hole 35 having a large diameter. Thus, in addition to the same effect as in the first embodiment, hydrogen can be supplied to the gate insulating film of each transistor at a uniform concentration.

It should be noted that after hydrogen is supplied from the second surface of the semiconductor substrate 2, a support substrate (not shown) may be bonded to the second surface of the semiconductor substrate 2 as in the first embodiment.

5. Application Example

The present invention can be applied to various electronic apparatuses such as a personal computer, a television, a mobile phone, and a compact information terminal. Further, the present invention can be applied to an image pickup apparatus as an example of the electronic apparatus.

Figure 13:
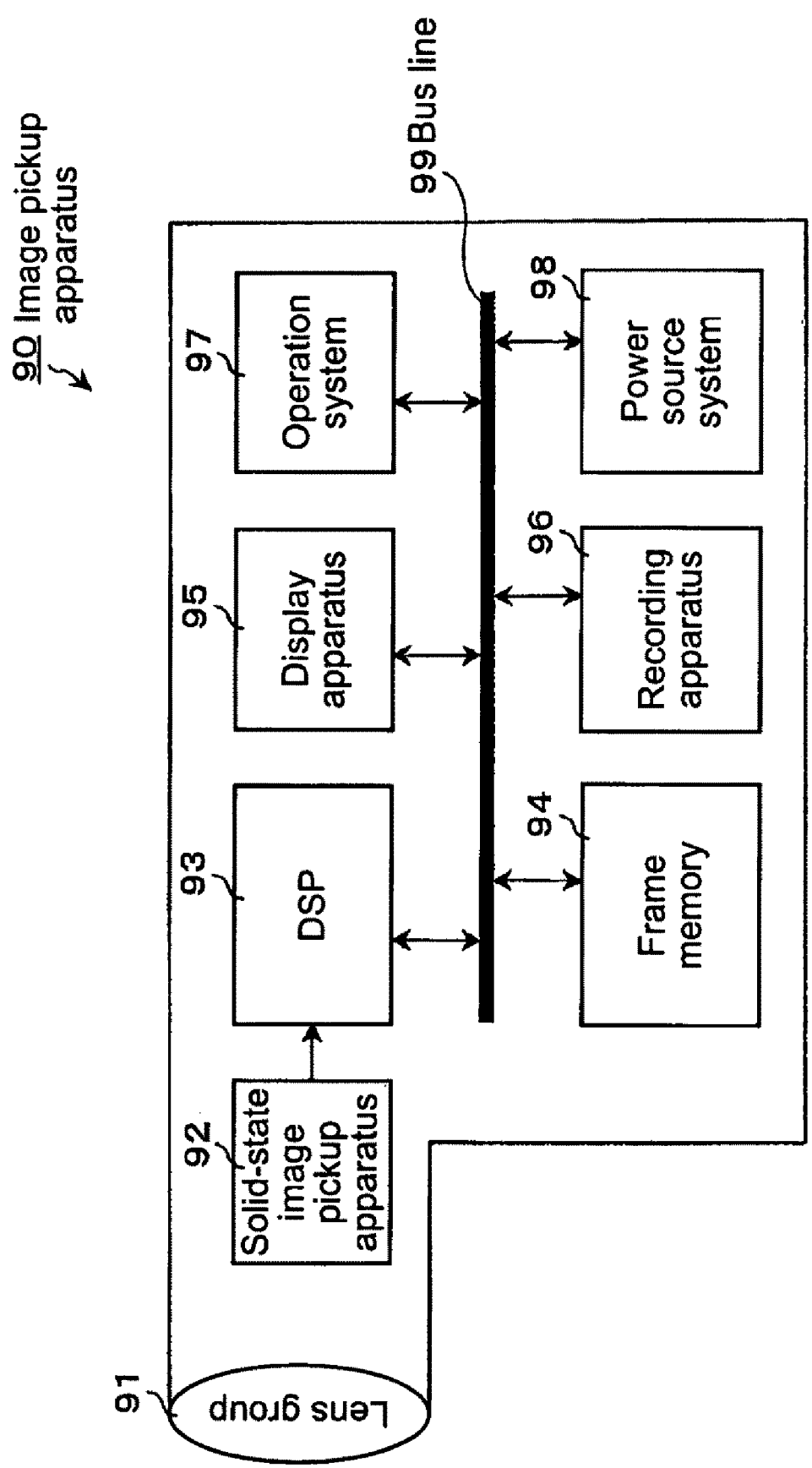
FIG. 13 is a block diagram showing a structural example of an image pickup apparatus to which the present invention is applied.

FIG. 13 is a block diagram showing a structural example of an image pickup apparatus to which the present invention is applied. An image pickup apparatus 90 shown in FIG. 13 includes an optical system having a lens group 91, a solid-state image pickup apparatus 92, a DSP circuit 93, a frame memory 94, a display apparatus 95, a recording apparatus 96, an operation system 97, and a power source system 98. Among those components, the DSP circuit 93, the frame memory 94, the display apparatus 95, the recording apparatus 96, the operation system 97, and the power source system 98 are mutually connected through a bus line 99.

The lens group 91 collects incident light (image light) from a subject and forms an image on an imaging surface of the solid-state image pickup apparatus 92. The solid-state image pickup apparatus 92 converts a light amount of the incident light that is imaged on the imaging surface by the lens group 91 into an electrical signal for each pixel, and outputs it as a pixel signal. As a device structure of the solid-state image pickup apparatus 92, the structure of the solid-state image sensor described above is applied.

The display apparatus 95 is formed of a panel-type display apparatus such as a liquid crystal display apparatus and an organic EL (electro-luminescence) display apparatus, and displays a moving image or a still image taken by the solid-state image pickup apparatus 92. The recording apparatus 96 records the moving image or the still image taken by the solid-state image pickup apparatus 92 on a recording medium such as a non-volatile memory, a videotape, and a DVD (digital versatile disk).

The operation system 97 gives operation commands for various functions of the image pickup apparatus 90 under the control of a user who uses the image pickup apparatus 90. The power source system 98 appropriately supplies various power sources as operation sources to the DSP circuit 93, the frame memory 94, the display apparatus 95, the recording apparatus 96, and the operation system 97.

The image pickup apparatus 90 as described above is applied to a camera module for a mobile apparatus, such as a video camera, a digital still camera, and a camera cellular phone. But, in addition to those modules, the present invention can also be applied to, for example, vehicles such as an automobile and an airplane in which a camera equipped with the solid-state image sensor is incorporated. In this case, in an example of an automobile, in a system that displays, on an in-car display apparatus, a blind spot for a driver by taking an image thereof, the device structure according to the above embodiments can be employed as the solid-state image sensor for cameras incorporated in the front, the back, the sides of the automobile. In addition, vehicles such as an automobile and an airplane equipped with the solid-state image sensor that uses the device structure of the above embodiments can be a form of the image pickup apparatus according to the present invention, in addition to image pickup apparatus including the camera module for the mobile apparatus described above.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor device, comprising:
    forming a transistor on a first surface of a device substrate;
    forming a hole in a second surface opposite to the first surface of the device substrate; and
    supplying hydrogen to a gate insulating film of the transistor from the second surface of the device substrate through the hole.

2. The method of manufacturing a semiconductor device according to claim 1,
    further comprising thinning the device substrate by performing one of etching and polishing on the second surface of the device substrate prior to the step of supplying the hydrogen.

3. The method of manufacturing a semiconductor device according to claim 1,
    wherein the step of supplying the hydrogen is performed by using one of a hydrogen sintering process, a hydrogen annealing process, a hydrogen plasma process, and a set of a hydrogen ion implantation process and an annealing process.

4. The method of manufacturing a semiconductor device according to claim 1,
    further comprising performing a heat treatment under a condition of 450° C. or less after the step of supplying the hydrogen.

5. The method of manufacturing a semiconductor device according to claim 1,
    further comprising bonding a support substrate to one of the first surface and the second surface of the device substrate after the step of supplying the hydrogen.

6. A semiconductor device, comprising:

a device substrate having a first surface and a second surface opposite to the first surface; and a transistor formed on the first surface of the device substrate, wherein the device substrate has a hole in the second surface, and wherein the device substrate has a thickness T2 where the hole is not formed and has a thickness T1 where the hole is formed such that a depth of the hole is equal to a difference T2−T1, in which T1 has a value less than or equal to 100 μm.

7. The semiconductor device according to claim 6, wherein the device substrate has a support substrate bonded to one of the first surface and the second surface thereof.

8. An electronic apparatus, comprising:

a semiconductor device including a device substrate having a first surface and a second surface opposite to the first surface, and a transistor formed on the first surface of the device substrate, wherein the device substrate has a hole in the second surface, and wherein the device substrate has a thickness T2 where the hole is not formed and has a thickness T1 where the hole is formed such that a depth of the hole is equal to a difference T2−T1, in which T1 has a value less than or equal to 100 μm.

* * * * *